US010175312B2

(12) United States Patent
Duensing et al.

(10) Patent No.: US 10,175,312 B2
(45) Date of Patent: Jan. 8, 2019

(54) DETACHABLE RECEIVER BLOCK COMPRISING A DIGITIZER FOR A FAMILY OF LOCAL RF COILS

(71) Applicant: KONINKLIJKE PHILIPS N.V., Eindhoven (NL)

(72) Inventors: George Randall Duensing, Eindhoven (NL); Olli T. Friman, Eindhoven (NL); Christopher Spencer, Eindhoven (NL); Drew Warren Humphreys, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 476 days.

(21) Appl. No.: 14/888,114

(22) PCT Filed: Apr. 22, 2014

(86) PCT No.: PCT/IB2014/060883
§ 371 (c)(1),
(2) Date: Oct. 30, 2015

(87) PCT Pub. No.: WO2014/177971
PCT Pub. Date: Nov. 6, 2014

(65) Prior Publication Data
US 2016/0061916 A1   Mar. 3, 2016

Related U.S. Application Data

(60) Provisional application No. 61/818,473, filed on May 2, 2013.

(51) Int. Cl.
G01R 33/36 (2006.01)
G01R 33/34 (2006.01)

(52) U.S. Cl.
CPC .... *G01R 33/3621* (2013.01); *G01R 33/34007* (2013.01); *G01R 33/34046* (2013.01); *G01R 33/36* (2013.01); *G01R 33/3692* (2013.01)

(58) Field of Classification Search
None
See application file for complete search history.

(56) References Cited

U.S. PATENT DOCUMENTS 5,372,137 A * 12/1994 Wong .................. A61B 5/0555
324/309
5,491,415 A    2/1996 Holmes
(Continued)

FOREIGN PATENT DOCUMENTS

CN      202383276 U    8/2012
WO      2004089211 A1  10/2004

*Primary Examiner* — Dixomara Vargas
*Assistant Examiner* — Douglas X Rodriguez

(57) ABSTRACT

An apparatus includes a magnetic resonance (MR) receiver. The MR receiver includes at least one galvanic connector, at least one digitizer connected to the at least one galvanic connector, a power supply connected to the at least one digitizer, and a housing. The at least one galvanic connector connects in a connected configuration to a radio frequency (RF) coil element of at least one local RF coil to receive MR signals. The at least one digitizer converts the received MR signals to a digital format. The power supply provides power to operate the at least one digitizer. The housing is configured to removably attach to a housing of at least one local RF coil in the connected configuration to enclose the at least one galvanic connector and at least one digitizer with the housing and the attached the at least one local RF coil housing.

20 Claims, 6 Drawing Sheets

(56) References Cited

U.S. PATENT DOCUMENTS

Figure 1:
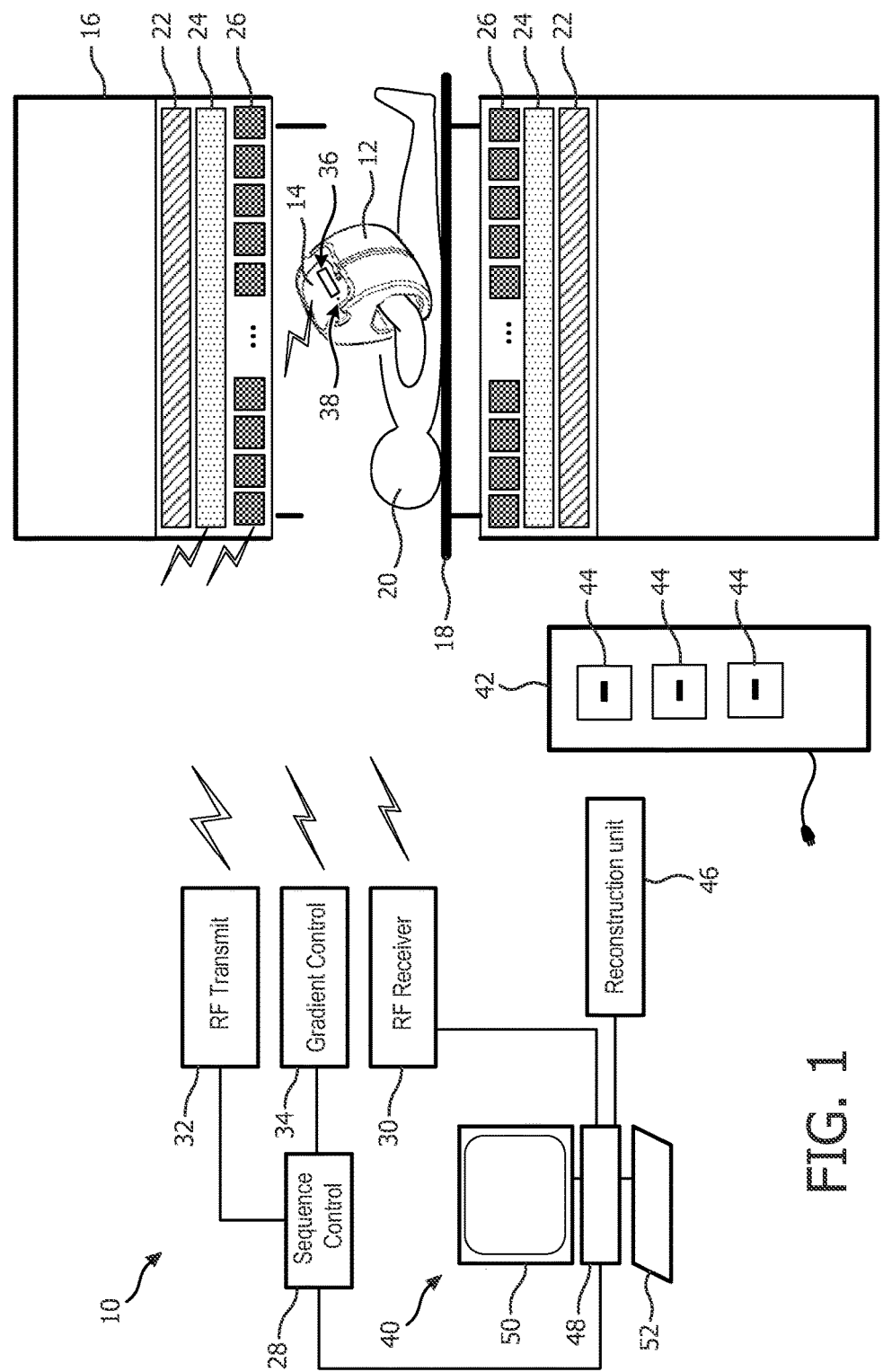

| | | | |
|---|---|---|---|
| 2008/0242137 A1* | 10/2008 | Mruthyunjaya | A61B 8/00 439/310 |
| 2009/0030305 A1 | 1/2009 | Hoogeveen | |
| 2009/0149737 A1 | 6/2009 | Hansen | |
| 2009/0251141 A1 | 10/2009 | Baumgartl | |
| 2010/0066368 A1* | 3/2010 | Gao | G01R 33/307 324/318 |
| 2010/0329527 A1 | 12/2010 | Iannotti | |
| 2012/0139538 A1 | 6/2012 | Schmidt | |
| 2014/0218034 A1* | 8/2014 | Ishii | G01R 33/3692 324/322 |
| 2016/0077172 A1* | 3/2016 | Duensing | G01R 33/34007 600/422 |

\* cited by examiner

DETACHABLE RECEIVER BLOCK COMPRISING A DIGITIZER FOR A FAMILY OF LOCAL RF COILS

CROSS-REFERENCE TO PRIOR APPLICATIONS

This application is a U.S. national phase application of International Application No. PCT/IB2014/060883, filed on Apr. 22, 2014, which claims the benefit of U.S. provisional Application Ser. No. 61/818,473 filed on May 2, 2013 and is incorporated herein by reference.

The following relates generally to magnetic resonance medical imaging. It finds particular application in conjunction with magnetic resonance (MR) local radio-frequency (RF) coils and the powering of such coils in the magnetic fields of an MR scanner, and will be described with particular reference thereto. However, it will be understood that it also finds application in other usage scenarios and is not necessarily limited to the aforementioned application.

Local RF coils are used with an MR scanner to image a portion of subject anatomy such as a wrist, forearm, knee, foot, shoulder, head, etc. The local RF coils operate in the static field of a MR scanner and in coordination with other parts of an MR imaging system. The local RF coil includes one or more coil elements that receive magnetic resonance decay signals and transmit the MR signals to a receiving unit. The MR signals are eventually converted into medical images. The local RF coil can include multiple coil elements which operate in parallel and provide MR signals on separate data channels. For example, a wrist coil can include 8 coil loops, each loop receives MR signals which are digitized and transmitted on one data channel. Each loop/channel operates in parallel to provide 8 channels of data transmitted to the receiving unit. Each coil type can include a different number of coil elements or loops. For example, a wrist coil can include 8 coil elements and a foot coil can include 16 coil elements. In some cases, the local RF coil can include a transmit mode which transmits RF pulses to excite magnetic resonance.

Local RF coils are typically powered from a shielded power cable connected to the local RF coil, although some designs use a battery for power. The shielded power cable shields the power supply from the powerful magnetic fields and provides safety for patients and healthcare practitioners operating the local RF coils. The power cable is typically combined with a data cable which transmits each data channel of the received MR signals from the local RF coil to the receiving unit for further processing. The data cable is typically a fiber optic cable which carries the data transmitted on one or more data channels and can be unshielded. The shielding of the power cable adds bulk to the cable, which adds to the effort by the healthcare practitioner to correctly place and position the local RF coil on the patient. The size of the shielded power cable can also intimidate the patient.

Local coil design includes consideration of components for operation, patient ergonomics and safety, and healthcare practitioner operation and safety. The local RF coil design is specific to the portion of anatomy, e.g. a different coil for each extremity and/or shape. Operational components are enclosed within the housing of the local RF coil and include a circuit or digitizer for each coil element. The digitizer converts the received analog MR signals from each coil element to a digital signal which is transmitted to a receiving unit for reconstruction into an image. The digitizer is typically housed in the local coil close to the coil element to provide a good signal to noise ratio (SNR).

The digitizer circuit uses power for operation, which is provided from a power source such as the power cable and/or battery. Powering the digitizer circuit with battery power can include additional problems. Batteries used with local RF coils may be subject to government regulatory approval for use with the local RF coil and must operate safely in the magnetic fields of the MR scanner. The local RF coil operation depends on an operational battery when the local RF coil is used on a patient and power is supplied from the battery. Use of a battery power local RF coil can frustrate usage by a healthcare practitioner if the battery is not charged and/or is not properly connected to the local RF coil. Usage can be further frustrated with insufficient provisions for battery recharge and/or replacement.

The following discloses a new and improved detachable receiver block for a family of local RF coils which addresses the above referenced issues, and others.

In accordance with one aspect, an apparatus includes a magnetic resonance (MR) receiver. The MR receiver includes at least one galvanic connector, at least one digitizer connected to the at least one galvanic connector, a power supply connected to the at least one digitizer, and a housing. The at least one galvanic connector connects in a connected configuration to a radio frequency (RF) coil element of at least one local RF coil to receive MR signals. The at least one digitizer converts the received MR signals to a digital format. The power supply provides power to operate the at least one digitizer. The housing is configured to removably attach to a housing of at least one local RF coil in the connected configuration to enclose the at least one galvanic connector and at least one digitizer with the housing and the attached the at least one local RF coil housing.

In accordance with another aspect, a method of magnetic resonance (MR) imaging with a local radio frequency (RF) coil, includes selecting the local RF coil and positioning the local RF coil on a subject. A detachable receiver block is attached to the local RF coil, the detachable receiver block includes at least one galvanic connector which connects to a RF coil element of the local RF coil to receive MR signals, at least one digitizer which connects to the at least one galvanic connector and converts the received MR signals to a digital format, and a power supply connected to the at least one digitizer which provides power to operate the at least one digitizer. A subject is imaged with the local RF coil and attached detachable local receiver block and an MR scanner.

In accordance with another aspect, a local magnetic resonance (MR) radio frequency (RF) coil includes a plurality of coil elements, a plurality of first galvanic connectors, a coil housing, and a detachable receiver block. The plurality of coil elements receive MR signals and transmit the signals as analog signals. Each first connector of the plurality of first galvanic connectors connects to one coil element. The coil housing encloses the plurality of coil elements. The detachable receiver block attaches in an attached configuration to the plurality of first galvanic connectors, converts the received MR signals to a digital format, and transmits the digitally formatted signals to a receiving unit.

One advantage is a component which can be shared across multiple local RF coils and multiple local RF coil types.

Another advantage is reduction in unit cost of local RF coils.

Another advantage resides in ease of use by a healthcare practitioner.

Another advantage resides in the variety of power sources adaptable for a local RF coil without remanufacturing or replacing a coil.

Another advantage includes reduction and/or elimination of cables utilized with the local RF coil.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 schematically illustrates an embodiment of an MR system with a detachable receiver block attached to a local RF coil.

Figure 2:
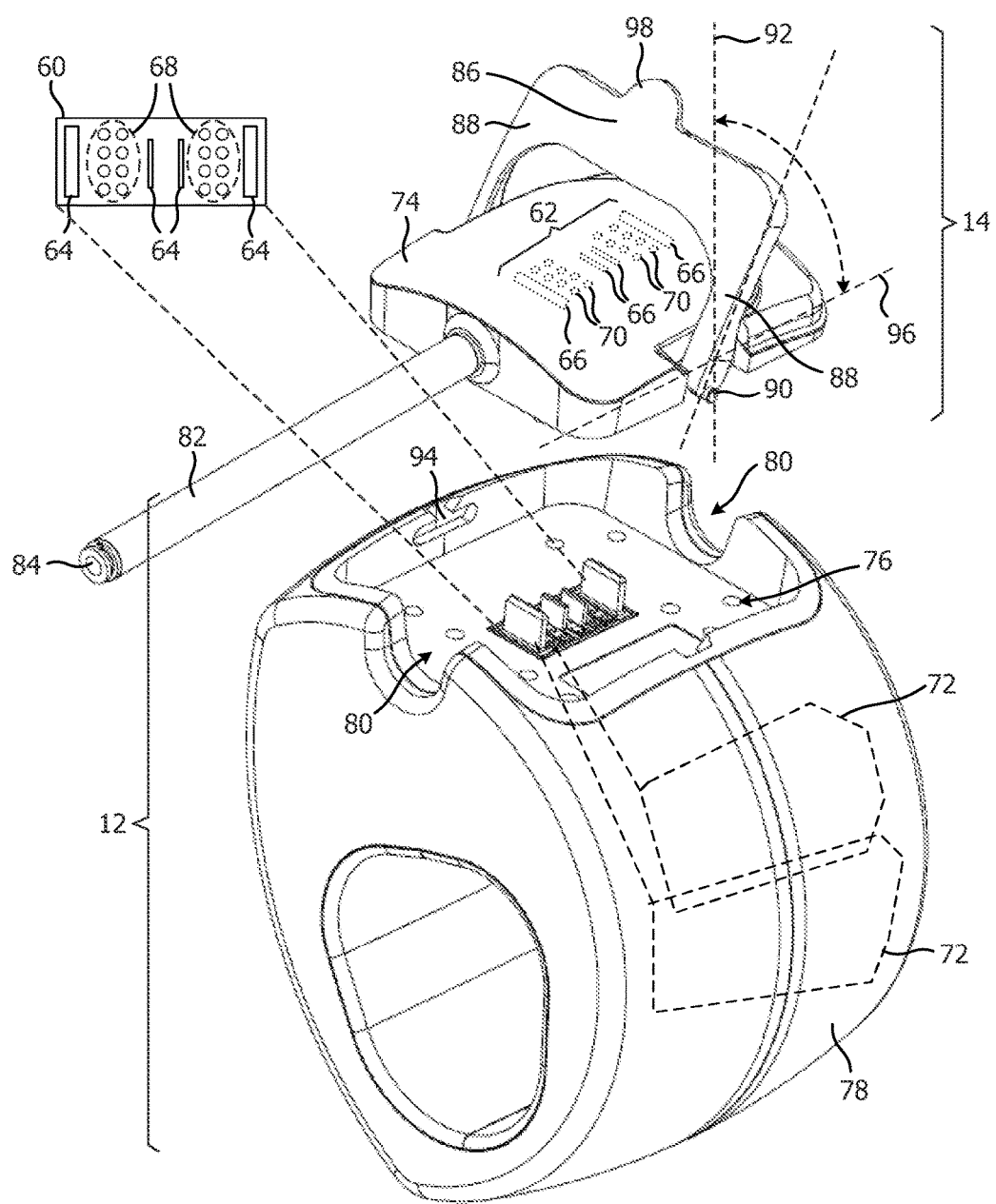

FIG. 2 schematically illustrates one embodiment of the detachable receiver block and local RF coil in a detached configuration.

Figure 3:
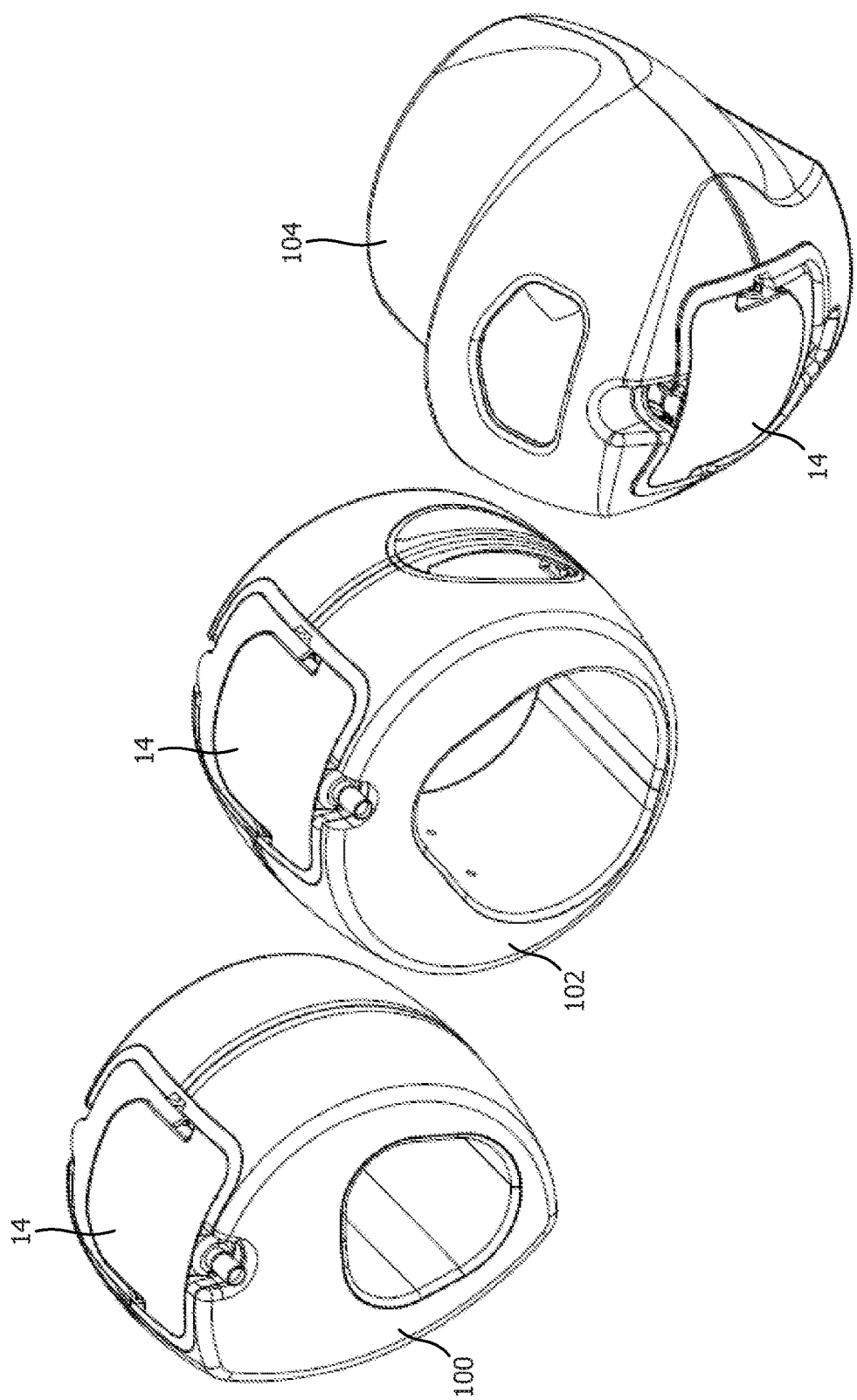

FIG. 3 schematically illustrates an embodiment of a family of local RF coils with the detachable receiver block.

Figure 4:
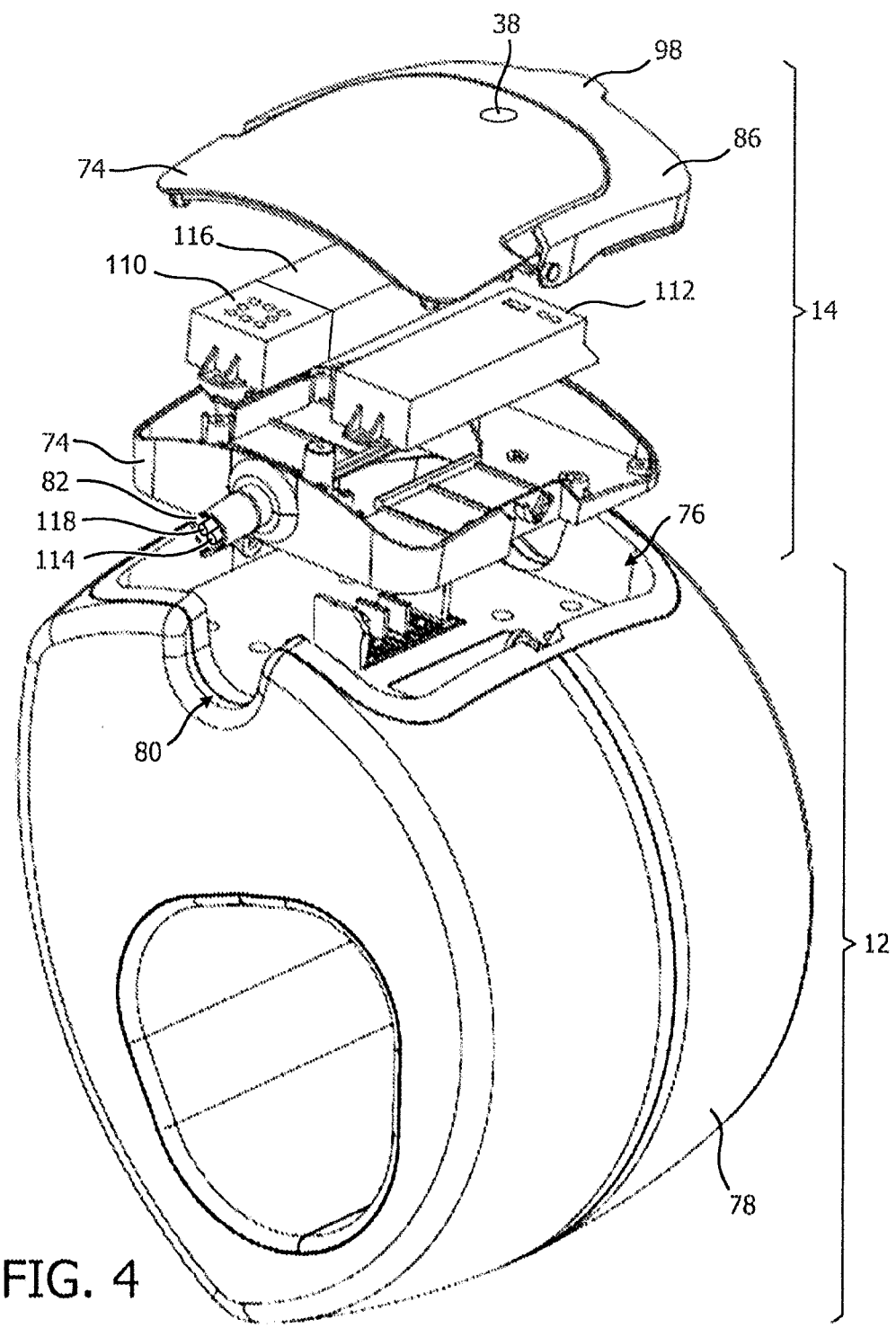

FIG. 4 schematically illustrates one embodiment of the detachable receiver block and local RF coil with the detachable receiver block components revealed with a cable.

Figure 5:
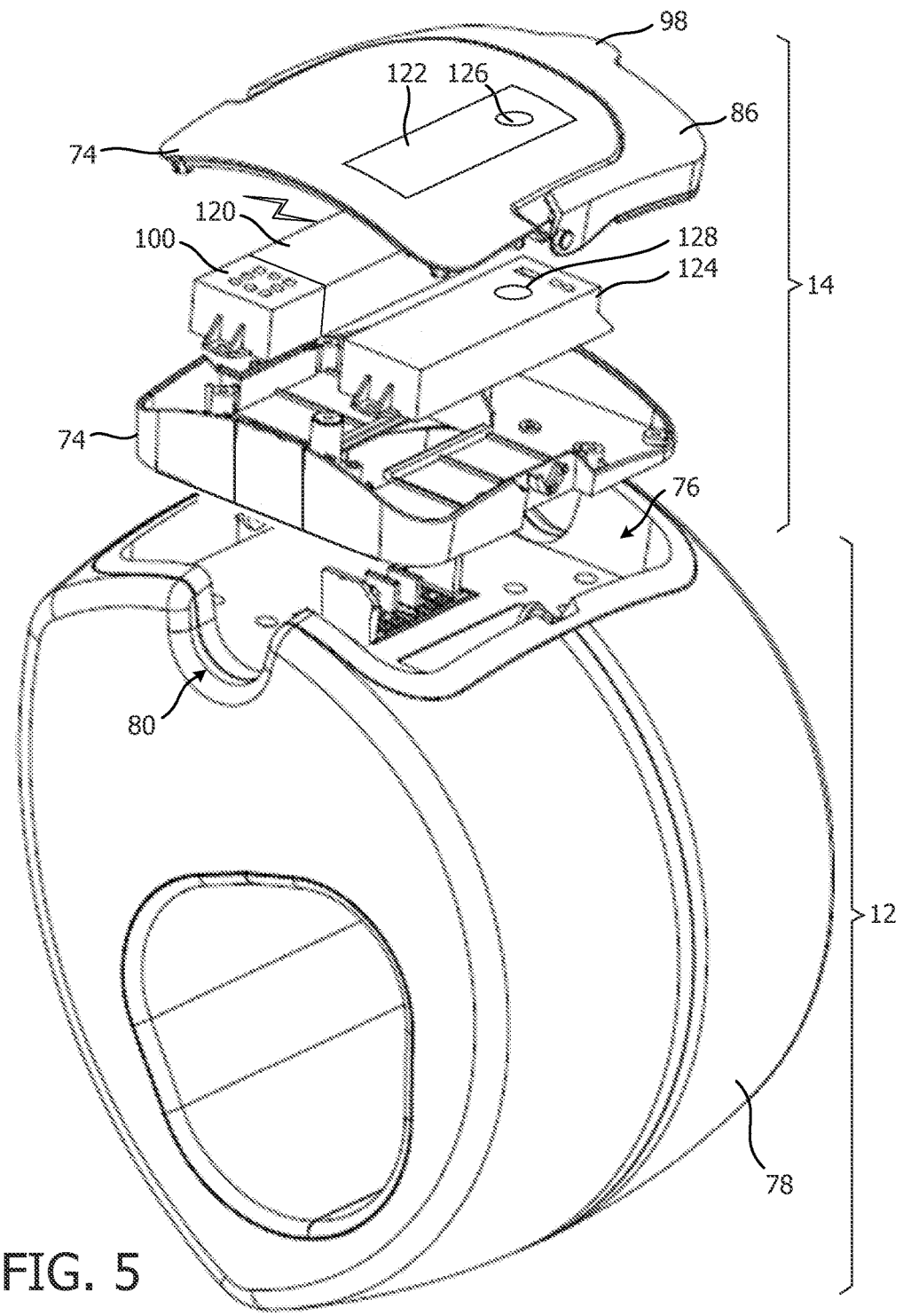

FIG. 5 schematically illustrates one embodiment of the detachable receiver block and local RF coil with the detachable receiver block components revealed with a wireless transmitter.

Figure 6:
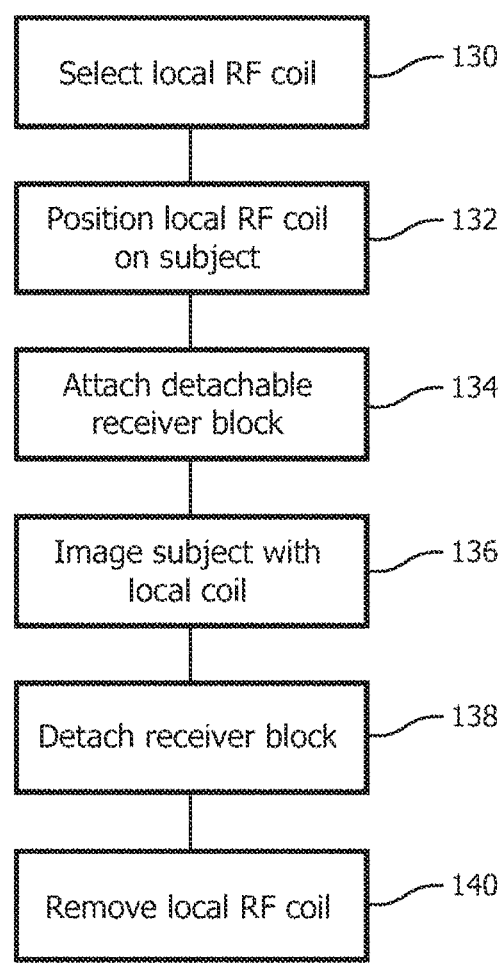

FIG. 6 flowcharts a method of using an embodiment of the detachable receiver block.

It is recognized herein that the digitizer circuit is a costly component of a local RF coil. The digitizer circuit is typically the same for each coil element and the same between local RF coils. The digitizer circuit represents a possible point of failure for a coil element or channel for the local coil, and repairs to local RF coils are expensive, interrupt patient operations and patient care. Power components with galvanic connectors that supply power to the digitizer circuit are carefully enclosed for patient safety to prevent contact and possible burns.

With reference to FIG. 1, an embodiment of an MR system 10 (shown in diagrammatic partial cross-section) with a local RF coil 12 and a detachable receiver block 14 is schematically illustrated. The local RF coil 12 and the detachable receiver block 14 are shown in an attached configuration. The detachable receiver block 14 is shown in a wireless embodiment. The MR system 10 includes a MR scanner 16 illustrated in cross section with a static $B_0$ main field such as a horizontal bore scanner, open system scanner, c-type scanner, vertical field scanner, and the like. The MR scanner includes a subject support 18 such as a horizontal bed or couch which supports a subject 20 and moves the subject into the MR scanner bore and static field during imaging. The MR scanner 16 includes a main magnet 22 whose poles generate the static main field ($B_0$) such as a horizontal main field. The MR scanner further includes one or more gradient coils 24 for applying gradient fields for manipulating resonance in the tissues of the subject. The MR scanner includes one or more RF coils 26 which generate RF pulses to excite magnetic resonance in the subject 20 such as a transmit mode and can receive resonance signals from the subject in a receive mode. In some embodiments the local RF coil 12 performs both transmit and receive functions, in which case the whole-body RF coil 26 is optionally omitted.

The local RF coil 12 includes one or more coils or coil elements which receive resonance signals from the subject in the receive mode and in some embodiments can operate in the transmit mode. For example, a wrist coil may include 4 coil elements, while a foot coil (not shown in FIG. 1) may include 8 coil elements. The detachable receiver block 14 can be used interchangeably with the wrist and foot local RF coils with support for a maximum number of coil elements in the family of local coils, e.g. 2, 4, 8, 16, 32, etc., but can operate with local RF coils with less than the maximum number. Each coil element adds a parallel data channel. The local RF coil can include an EPROM which carries a coil identifier and informs the detachable receiver block the number of actual coil elements. As other contemplated approaches, the socket receiving the receiver block 14 can include keying elements to indicate the number of coil elements present, or each channel of the receiver block can perform a suitable circuit test to determine whether a corresponding coil is present and connected when the receiver block 14 is inserted into the socket.

The system 10 includes a sequence controller 28 and a RF receiver unit 30. The sequence controller controls the operation of the imaging sequence which includes a RF transmitter unit 32 controlling the operation of the RF coils 26 and/or the local RF coil 12 with the detachable receiver block 14 and a gradient controller 34 controls the operation of the gradient coils 24. The communication between the controlling unit and the corresponding coils can be wireless or wired. In the embodiment shown, the local RF coil 12 and the detachable receiver block 14 operate wirelessly. The RF transmitter unit 32 works cooperatively with the local coil 12 when the local coil is configured as a transmit/receive coil. The RF receiver 30 receives RF data, e.g. MR signals as digitally formatted data from the detachable receiver block attached to the local RF coil 12 indicative of the magnetic resonance excited in the tissue of the subject. The digitally formatted MR data can be communicated between the local RF coil and the RF receiver wirelessly, e.g. in accord with an IEEE 802.3 protocol, or via a wired connection. In one wireless embodiment, power can be supplied with a power supply 36 such a removable battery.

The power supply 36 can include a power supply indicator 38 such as an LED light or lights, LED readout, and the like which indicate a status of the power supply. For, example, a green LED can be used to indicate a fully operational power supply, while a red LED can indicate a possible problem such as a low charge. Multiple LEDs can be used to indicate a relative status such as a measure of battery power remaining. Alternatively, a small LED display can include bars or other icons which indicate the status. Other indicator types and configurations are contemplated. Power supply operational status can also be checked remotely using a system console 40 such as a workstation. The system console 40 can provide further operational status such as connection status, or to verify compliance with FDA approval requirements as part of the device usage on a patient. For example, a serial number or battery identifier can be transmitted to provide verification of the battery identity to the system and usage with the particular local RF coil.

The system 10 can include a battery recharging station 42. The recharging station can be configured to receive at an attachment interface 44 either the battery removed from the detachable receiver block 14 or receive the detachable receiver block 14 with the battery in the same manner as attached to the local RF coil 12.

A reconstruction unit 46, embodied as a configured processor such as a processor 48 of a system console 40, receives the digitally formatted MR data from the RF receiver 30 and reconstructs one or more images. The system console 40 includes the electronic processor or electronic processing device 48, a display 50 which displays the reconstructed image, power supply operational status, menus, panels, and user controls, and the at least one input device 52 which inputs a healthcare practitioner selections. The system console 40 can be a desktop computer, a laptop, a tablet, a mobile computing device, a smartphone, and the like. The input device 52 can be a keyboard, a mouse, a microphone, and the like. The reconstruction unit is suitably embodied by an electronic data processing device, such as the electronic processor or electronic processing device 48 of the system console 40, or by a network-based server computer operatively connected with the system console 40 by a network, or so forth. Moreover, the reconstruction technique is suitably implemented using a non-transitory storage medium storing instructions (e.g., software) readable by an electronic data processing device and executable by the electronic data processing device.

With reference to FIG. 2, one embodiment of the detachable receiver block 14 and the local RF coil 12 in a detached configuration is schematically illustrated in perspective view. The connectors 60 are also shown in an inset top view in the upper left, which connect to the connectors 62 of the detachable receiver block 14 (connectors 62 are shown in phantom in FIG. 2). The connectors 60, 62 include physical connectors 64, 66 and galvanic connectors 68, 70. The physical connectors 64, 66 guide the attachment of the detachable receiver block 14 to the local RF coil 12 and provide protection for the galvanic connectors 68, 70. Each coil element 72 of the local RF coil 12 connects with a first galvanic connector 68 of the local RF coil. The first galvanic connectors 68 of the local RF coil 12 connect to a second set of galvanic connectors 70 of the detachable receiver block 14. Depending on the local RF coil 12 and the number of coil elements 72, there can be galvanic connectors 70 in the second set which are unused for particular coil types with fewer than the maximum number of coil elements for the local coil family.

The detached configuration shows the separation between a housing 74 of the detachable receiver block 14 and a receiving region (e.g. socket) 76 in a housing 78 of the local RF coil 12. In the detached configuration, the connectors 60, 62 are exposed. In the attached configuration as describe in reference to FIG. 1, the connectors are enclosed between the detachable receiver block housing 74 and the local RF coil housing 78. The housings are made of MR inert material. The receiving region or socket 76 includes a complementary depression in the surface of the local RF coil housing 78 to receive the detachable receiver block 14 in the attached configuration. The receiving region 76 can include one or more cut-outs 80. The cut-outs can provide for positioning and supporting a cable 82 and/or access for the healthcare practitioner/operator to grip the detachable receiver block during attachment and detachment. In the shown configuration, the cut-outs 80 are positioned 180° and the connectors 60, 62 located symmetrically, which allows attachment of the detachable receiver block in either one of two 180° orientations. In another embodiment, the receiving region can include a contoured surface of the local RF coil housing 78 which mates with a complementary contoured surface of the detachable receiver block 14 to enclose the connectors 60, 62. Providing a smooth and uniform surface allows for easier handling by the operator.

The cable 82 can include one or more optical fibers 84. The optical fiber can be used to communicate the digitally formatted MR signals from each coil element to the RF receiver 30 and for transmitting control information to each of the coil elements. In one embodiment, the optical fiber can be used to deliver power. For example, light delivered by laser through the optical fiber can be converted to electrical power. In another embodiment, the cable can include a copper wire. If the local RF coil is battery-powered and employs wireless transmission of signals, then the cable 82 may be omitted.

The detachable receiver block 14 can include an attachment mechanism 86 connected to the detachable receiver block housing 74. The attachment mechanism 86 operates to secure the detachable receiver block 14 to local RF coil 12. The attachment mechanism can operate to secure the detachable receiver block 14 to the attachment interface 44 of the charging station 42. The attachment mechanism 86 includes one or more levers 88, each lever with a locking element 90. The levers 88 can be connected to either side of the block housing 74 and rotate about a hub that defines an fulcrum for the lever on an axis through the block housing. The levers in a first position 92 positions the locking element 90 to be received in a receiving locking element 94 of the local RF coil housing 78. For example, with the receiving locking element 94 configured as an inverted "T" slot and the locking element 90 as a pin, the locking element slides down the stem of the "T". The levers 88 are depressed to the surface of the housing which moves the levers to a second position 96. The movement of the lever 88 moves the pin laterally in the bottom slot to hold the detachable receiver block securely to the local RF coil housing and connectors. To detach the detachable receiver block, the attachment mechanism 86 can include a projection or tab 98 which extends into a cut-out 80. The operator lifts the tab 98 with a finger which moves the levers 88 from the attached position 96 to the detached position 92. The operator can separate the detachable receiver block 14 from the local RF coil 12 by gripping the receiver block housing 74 through the cut-outs 80 and/or gripping the attachment mechanism 86. Other attachment mechanisms are contemplated such as straps, clips, and the like.

The internal components of the detachable receiver block 14 can include an amplifier, circuitry for decoupling during transmit, multiplexer for multiplexing the digitally formatted data. The cable can include one or more optical fibers and in one embodiment a copper line for conveying DC power. In one embodiment, the cable is detachable from the detachable receiver block.

With reference to FIG. 3, an embodiment of a family of local RF coils with the detachable receiver block is schematically illustrated. The family of local RF coils can include different local RF coil types such as a small extremity, a head coil, a shoulder coil, a wrist coil, a knee coil, an ankle coil, a foot coil, and the like. FIG. 3 shows three coil types which include a small extremity local RF coil 100, a knee local RF coil 102, and a foot local RF coil 104. Each local RF coil in the family can include different numbers of coil elements and each local RF coil can be used with the same detachable receiver block 14. Multiple instances of the detachable receiver block 14 can also be used.

For example, the three local coils can share one or more detachable receiver blocks, e.g. local coils are interchangeable with a block. With interchangeable detachable receiver blocks, the healthcare practitioner can work with a large number of local RF coils and one detachable receiver block. In another example, the healthcare practitioner works with two detachable receiver blocks, one charging while the other is in use, e.g. blocks are interchangeable with local coils. The interchangeability of the block between coils and coil between blocks provides flexibility and ease of use.

With reference to FIG. 4, one embodiment of the detachable receiver block 14 and local RF coil 12 with the detachable receiver block components revealed with the end of the cable 82 proximate to the receiver block 14 schematically illustrated. The detachable receiver block 14 includes one or more digitizers 110, and each digitizer connects to galvanic connectors 70 of the detachable receiver block 14. The galvanic connectors 70 of the detachable receiver block connect to the galvanic connectors 68 of the local RF coil and in turn to each coil element 72. Each coil element of the local RF coil is connected to one digitizer or digitizing circuit which converts the received MR signals by the each element from an analog format to a digital format The digitizers operate in parallel. When the receiver block 14 is installed in a selected local RF coil, there may be unused digitizers in the detachable receiver block 14. For example, if the selected local RF coil includes 8 coil elements, and the detachable receiver block is configured for 16 digitizers, then 8 digitizers will be unused with the selected coil.

The detachable receiver block 14 includes a power supply, which provides power to operate the digitizers. The power supply can include a power converter 112 connected to an optical fiber 114 and converts light to electrical power such as with a high intensity laser. In one embodiment, the power supply includes a copper cable in the cable 82 which feeds direct current to the digitizers.

The detachable receiver block 14 includes an electrical to optical converter 116 connected to the digitizers 110 which transmits the digitally formatted MR signals optically over an optical fiber 118 in the cable 82.

With reference to FIG. 5, one embodiment of the detachable receiver block 14 and local RF coil 12 with the detachable receiver block components revealed with a wireless transmitter 120 is schematically illustrated. The detachable receiver block 14 can include a removable hatch cover 122 for access to a removable battery 124. The removable hatch cover can include a transparent portion 126 which allows the power supply indicator such as a battery power indicator 128 to be viewed externally. In alternative embodiments the power supply indicator 38 is located separately from the hatch cover, but visible externally when the detachable receiver block is attached to the local RF coil.

FIG. 6 flowcharts a method of using an embodiment of the detachable receiver block 14. In a step 130, a health care practitioner selects a local RF coil. The selected local RF coil can be from a family of local RF coils of different types and/or different numbers of coil elements. In a step 132, the selected local RF coil is positioned on a subject. The positioning includes receiving a portion of the subject anatomy into the field of view of the local RF coil.

The detachable receiver block is attached to the selected local RF coil in a step 134. The steps 132, 134 of attachment of the detachable receiver block and the positioning of the local RF coil can be in either order. The detachable receiver block includes at least one galvanic connector which connects to a RF coil element of the local RF coil to receive MR signals. The detachable receiver block includes at least one digitizer which connects to the galvanic connector and converts the received MR signals to a digital format. The detachable receiver block includes a power supply connected to the digitizer and provides power to operate the digitizer. The power supply can include a battery and the step can include inserting the battery into the detachable receiver block or detaching the detachable receiver block from a charging station. The step can include verifying the power supply status of the power supply visually with a power supply indicator of the detachable receiver block. The step can include verifying the operational status of the battery or power supply through a system console. The step can include replacement and/or recharging of the battery. The step can include operating an attachment mechanism which secures the detachable receiver block to the housing of the selected local RF coil. The step can include replacement of the detachable receiver block with another detachable receiver block such as in the event of a problem is determined either by visual inspection or through the system console.

The subject is imaged with the local RF coil and attached detachable receiver block and a MR scanner in a step 136. The MR imaging system as described in reference to FIG. 1 reconstructs an image of the subject anatomy positioned in the imaging region of the selected local RF coil. The subject and/or local RF coil can be repositioned.

The detachable receiver block is detached in a step 138 by the healthcare practitioner or operator from the local RF coil. The step can include attaching the detachable to receiver to a charging station or to another selected local RF coil. The local RF coil is removed from the subject in a step 140. The method can repeat with a different selected local RF coil and the same detachable receiver block, or the same selected local RF coil and a different detachable receiver block.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A system comprising:
   a family of interchangeable local magnetic resonance (MR) coils;
   a receiver block configured for interconnection with any one of the local MR coils of the family, the receiver block comprising:
      at least one galvanic connector configured to connect in a connected configuration to a radio frequency (RF) coil element of a selected one of the local MR coils to receive MR signals;
      at least one digitizer connected to the at least one galvanic connector, the at least one digitizer configured to convert the received MR signals to a digital format;
      a power supply connected to the at least one digitizer and configured to provide power to operate the at least one digitize;
      a receiver block housing configured to removably attach to a housing of any one local MR coils of the family in the connected configuration, the receiver block housing enclosing the at least one galvanic connector and the at least one digitizer such that the at least one digitizer digitizes the received MR signals from the selected one of the MR coils to which the receiver block is connected.

2. The system according to claim 1, wherein the receiver block further includes:
   a manual attachment mechanism which in the connected configuration is configured to hold the receiver block housing securely to the local MR coil housing of the selected local MR coil of the family.

3. The system according to claim 2, wherein the attachment mechanism includes:
   a lock element configured to detachably engage the housing of the local MR coil; and
   at least one lever attached to the lock element and configured to be manually rotated to a first position that positions the lock element to engage the local MR coil housing, and configured to be manually rotated to a second position which positions the lock element in a detachable position.

4. The system according to claim 1, wherein the power supply includes:
   a removable battery disposed in the receiver block housing and connected to the at least one digitizer and configured to provide power to operate the at least one digitizer; and
   a battery status indicator connected to the battery and visible externally to the receiver block housing.

5. The system according to claim 1, wherein the receiver block further includes at least one of:
   a wireless transmitter connected to the at least one digitizer and the power supply and configured to transmit the digitized MR signals wirelessly; or
   an optical converter connected to the at least one digitizer and the power supply and connected to at least one optical fiber for transmitting the digitized MR signals optically.

6. The system according to claim 1, wherein the power supply includes:
   an optical power converter connected to an optical fiber and configured to convert light to electrical power for powering the at least one digitizer.

7. The system according to claim 1, wherein the family includes interchangeable local MR coils with different interchangeable numbers of coil elements between 1 and N, where N is a plural integer and wherein N digitizers are held in the receiver block housing to digitize the MR signals received by up to N RF coil elements.

8. The system according to claim 1, wherein the housing, the at least one galvanic connector, and the attachment mechanism are configured symmetrically to be attached to any one of the local MR coils in either one of two orientations.

9. The apparatus according to claim 1, wherein:
   the family of interchangeable local MR coils includes at least one of a small extremity coil, a knee coil, or a foot coil, and each of the local MR coils are configured to attach interchangeably to the receiver blocks.

10. A method of magnetic resonance (MR) imaging with a local radio frequency (RF) coil of a family of local RF coils, comprising:
    selecting one of the local RF coils and positioning the selected local RF coil on a subject;
    attaching a detachable receiver block to the selected local RF coil, the detachable receiver block includes at least one galvanic connector which connects to an RF coil element of the selected one local RF coil to receive MR signals, at least one digitizer which connects to the at least one galvanic connector and converts the received MR signals to a digital format, and a power supply connected to the at least one digitizer which provides power to operate the at least one digitizer;
    imaging the subject with the selected local RF coil using the at least one digitizer of the attached detachable receiver block to digitize received MR signals;
    manually detaching the detachable receiver block from the selected local RF coil:
    removing the selected local RF coil from the subject;
    selecting another local RF coil of the family of local RF coils and positioning the selected another RF coil on a subject;
    manually attaching the detachable receiver block to the selected another local RF coil; and
    imaging the subject with the selected another local RF coil using the at least one digitizer of the attached detachable receiver block to digitize received MR signals such that the same digitizer is utilized, at different times, to digitize MR signals received by both the selected local RF coil and the selected another RF coil.

11. The method according to claim 10, further including:
    disconnecting the power supply from a charging station before attaching the detachable receiver block to the local RF coil.

12. The method according to claim 10, wherein imaging the subject further includes transmitting the digitally formatted MR signals by at least one of:
    wirelessly with a wireless transmitter disposed in the receiver block and connected to the at least one digitizer; or
    optically with an optical converter disposed in the receiver block and connected to the at least one digitizer and an optical fiber.

13. The method according to claim 10, wherein the power supply includes an optical power converter connected to an optical fiber, and further including:
    converting light from the optical fiber to electrical power; and
    powering the at least one digitizer with the electric power from the optical power converter.

14. A receiver block for detachable electromechanical interconnection with any one of a family of local MR coils which each include a local coil housing with a connection area shaped to receive the receiver block, one or more coil elements configured to receive radio frequency MR signals, the local MR coils of the family including different numbers of coil elements, the local MR coils not including digitizers, the receiver block comprising:

- a receiver block housing configured to be received in the local coil housing connection area;
- a plurality of connectors configured to make a galvanic connection with the coil elements of a local MR coil of the family with a largest number of the coil elements;
- a plurality of digitizers connected with the connectors and configured to digitize radiofrequency MR signals from a one of the local MR coils to which the receiver block is attached in parallel, the plurality of digitizers being as large as the largest number of the coil elements the local MR coils of the family;
- an attachment mechanism configured to attach the receiver block housing to any one of the local coil housings with the galvanic connections between each coil element and a corresponding digitizer in an attached state and with the receiver block detached from the local coil housing in a detached state.

15. The receiver block according to claim 14, wherein the attachment mechanism is manually movable between the attached state and the detached state.

16. The receiver block according to claim 15, wherein the attachment mechanism includes a lever which pivots between an attached position in which a lock element engages the local coil housing and the detached position in which the lock element is withdrawn out of engagement with the local coil housing.

17. The receiver block according to claim 15, further including a plurality of non-galvanic physical connectors configured to guide the receiver block and each local MR coil into alignment during attachment.

18. The receiver block according to claim 15, further including a cable extending from the receiver block housing to a magnetic resonance imaging system.

19. The receiver block according to claim 18, wherein the cable includes optical fibers.

20. In combination, the receiver block according to claim 14 and a family of local MR coils, each local coil of the family including a local coil housing with a connection area shaped to receive the receiver block, One or more coil elements configured to receive radio frequency MR signals, wherein the local coils of the family include local coils with different numbers of coil elements and different numbers of galvanic connectors configured to interface with a subset of the galvanic connectors of the receiver block.

* * * * *